United States Patent
Zagwijn et al.

(10) Patent No.: US 8,242,029 B2
(45) Date of Patent: Aug. 14, 2012

(54) METHOD FOR FORMING A SILICON DIOXIDE/METAL OXIDE-NANOLAMINATE WITH A DESIRED WET ETCH RATE

(75) Inventors: Peter Zagwijn, LX Nijkerk (NL); Hyung-Sang Park, Seoul (KR); Stijn De Vusser, Heverlee (BE)

(73) Assignee: ASM International N.V., Almere (NL)

( * ) Notice: Subject to any disclaimer, the term of this patent is extended or adjusted under 35 U.S.C. 154(b) by 285 days.

(21) Appl. No.: 12/623,871

(22) Filed: Nov. 23, 2009

(65) Prior Publication Data

US 2011/0121430 A1 May 26, 2011

(51) Int. Cl.
*H01L 21/31* (2006.01)
*H01L 21/469* (2006.01)

(52) U.S. Cl. .......................... 438/763; 438/703; 257/618

(58) Field of Classification Search .................. 438/703, 438/763; 257/618; 977/775
See application file for complete search history.

(56) References Cited

U.S. PATENT DOCUMENTS

| | | | |
|---|---|---|---|
| 5,030,319 A * | 7/1991 | Nishino et al. | 216/87 |
| 2001/0032829 A1* | 10/2001 | Honda et al. | 216/108 |
| 2006/0189159 A1* | 8/2006 | Derderian et al. | 438/778 |
| 2007/0042608 A1* | 2/2007 | Fucsko et al. | 438/745 |

\* cited by examiner

*Primary Examiner* — Phuc Dang
(74) *Attorney, Agent, or Firm* — Weingarten, Schurgin, Gagnebin & Lebovici LLP

(57) ABSTRACT

An atomic layer deposition-deposited silicon dioxide/metal oxide-nanolaminate, comprising at least one layer of silicon dioxide and at least one layer of a metal oxide, and having a wet etch rate in an etchant, said wet etch rate being either greater or smaller than both a wet etch rate of a film of silicon dioxide and a wet etch rate of a film of said metal oxide in said etchant. Also provided is a method for manufacturing the same.

6 Claims, 1 Drawing Sheet

US 8,242,029 B2

METHOD FOR FORMING A SILICON DIOXIDE/METAL OXIDE-NANOLAMINATE WITH A DESIRED WET ETCH RATE

FIELD OF THE INVENTION

The present invention relates to the field of semiconductor processing, and more in particular to the formation of a dielectric, silicon dioxide/metal oxide-nanolaminate having a desired, typically low, wet etch rate.

BACKGROUND

Silicon dioxide ($SiO_2$) is in common use in the semiconductor industry, typically as an insulator. To create a desired insulating structure, a silicon dioxide film may be applied first. The silicon dioxide film may be applied in different ways, such as by means of atomic layer deposition (ALD). ALD is an advantageous option as it results in the deposition of high quality spatially uniform, conformal and dense films. Once a silicon dioxide film has been deposited, undesired portions of the applied film may be selectively etched away to create the aforementioned structure, commonly through wet etching using a hydrofluoric acid (HF) solution. In other applications, undesired portions of additional films deposited over the silicon dioxide film, instead of the silicon dioxide film itself, may be selectively etched away to create the aforementioned insulating structure in a similar manner. An important parameter in wet etching is the wet etch rate, i.e. the rate of material removal. Although the wet etch rate may be expressed independent-ly in for example nano- or micrometers per minute, it is often phrased in terms of a wet etch rate ratio (WERR). Given certain process conditions—e.g. the choice of etchant, its concentration and the temperature at which the etching takes place—the WERR of a film may be calculated by dividing the wet etch rate of the film by the wet etch rate of thermal silicon dioxide. Thermal silicon dioxide, often briefly referred to as 'thermal oxide', may be created through thermal oxidation of a silicon wafer surface. It is a highly stable and pure oxide with a relatively low etch rate, and is frequently used as a reference.

For many applications silicon dioxide-based, ALD-depositable films having either a low or a high WERR—with hydrofluoric acid as the etchant—are desirable. It is an object of the present invention to provide for such a film and for a method for manufacturing the same.

SUMMARY OF THE INVENTION

According to one aspect of the invention a method for manufacturing a nanolaminate is provided. Said nanolaminate may comprise a number of alternating atomic layer deposition-deposited layers of silicon dioxide and a metal oxide. The nanolaminate may further have a desired wet etch rate with respect to an etchant. The method may comprise choosing the desired wet etch rate for the nanolaminate to be manufactured, and determining, from a predetermined relation between wet etch rates of atomic layer deposition-deposited silicon dioxide/metal oxide-nanolaminates and their compositional ratios, what compositional ratio of silicon dioxide and said metal oxide is required to obtain a nanolaminate with the desired wet etch rate. The method may also comprise manufacturing the nanolaminate with the determined compositional ratio. The desired wet etch rate of the nanolaminate may either be greater or smaller than both a wet etch rate of a film of said nanolaminate-constituting silicon dioxide and a wet etch rate of a film of said nanolaminate-constituting metal oxide in said etchant.

Another aspect of the invention is directed to a silicon dioxide/metal oxide-nanolaminate. The nanolaminate may comprise at least one layer of silicon dioxide and at least one layer of a metal oxide, and have a wet etch rate in an etchant, said wet etch rate being either greater or smaller than both a wet etch rate of a film of said nanolaminate-constituting silicon dioxide and a wet etch rate of a film of said nanolaminate-constituting metal oxide in said etchant.

It is understood that the phrases 'a film of said nanolaminate-constituting silicon dioxide' and 'a film of said nanolaminate-constituting metal oxide' refer to reference films of silicon dioxide and metal oxide respectively, which films have been manufactured in the same way as in which the individual layers of the nanolaminate have been manufactured.

The proposed method and nanolaminate are based on experimental research that has revealed that the wet etch rate of an ALD-deposited silicon dioxide film by hydrofluoric acid solutions may be altered advantageously by interspersing it with layers of aluminum oxide ($Al_2O_3$). More particularly, it has been found that the addition of relatively thin layers of aluminum oxide to an otherwise substantially pure silicon dioxide film may result in a compound film or nanolaminate having a wet etch rate that is greater or smaller than that of both its constituents, i.e. silicon dioxide and aluminum oxide, independently. This is rather surprising, as one would expect the wet etch rate of the nanolaminate to fall in between the two wet etch rates of its constituents, and scale with their ratio. This, however, turns out not to be the case. Instead, both unexpectedly low and high wet etch rates may be achieved by properly selecting the compositional ratio of the constituents in the nanolaminate.

It is conjectured that the experimental findings described above may be generalized to at least some degree. It is likely, for example, that results similar to those described may be obtained with metal oxides other than aluminum oxide, such as, for example, yttrium oxide ($Y_2O_3$). Likewise, it is believed that etchants other than hydrofluoric acid solutions may produce similar results.

In contrast, it is doubtful to what extent deposition techniques other than ALD may be employed to practice the invention. This is because the material characteristics of nanolaminates may depend on their method of manufacture. For example, it is possible to deposit the silicon dioxide layers of an $SiO_2$/$Al_2O_3$-nanolaminate by means of a technique called rapid surface-catalyzed vapor deposition (RVD). RVD is similar to ALD in that reactant gases are introduced alternately over a substrate surface, but in RVD the first reactant A acts as a catalyst, promoting the growth of a 'polymeric layer' of second silicon-comprising reactant B. As the polymeric layer of reactant B grows, the polymeric chains in the layer may cross-link to form a silicon dioxide layer. The structure and characteristics of the thus obtained layer are dependent on the parameters of the deposition process, such as, for example, the formation rate of the film. Post-deposition processing may further alter these characteristics, but it is unlikely that the silicon dioxide layers that may eventually be obtained this way have the same properties as ALD-deposited silicon dioxide layers. Furthermore, depositing a nanolaminate using RVD for the silicon dioxide layers, and a different method for the metal oxide layers, may unnecessarily complicate the deposition process. Accordingly, the nanolaminate as proposed by the present invention may preferably be deposited using ALD.

With regard to the state of the art, the following is noted.

US 2006/021548 A1 discloses that the resistance of an aluminum oxide ($Al_2O_3$) film to resist developer etch may be increased by interspersing the aluminum oxide with layers of silicon dioxide ($SiO_2$) so as to form a $Al_2O_3/SiO_2$-nanolaminate. Since silicon dioxide is more resistant to an etch process by photoresist developer than $Al_2O_3$, US '548 teaches that larger contributions of silicon dioxide to the nanolaminate give rise to smaller etch rates (cf. FIG. 9B). Accordingly, US '548 fails to disclose that the wet etch rate of silicon dioxide films, and more particularly the wet etch rate of such films in a hydrofluoric acid solution, may be lowered to below the etch rates of a pure $SiO_2$-film and a pure $Al_2O_3$-film, or alternatively be raised to above the etch rates of said pure films, by suitably interspersing the silicon dioxide with layers of aluminum oxide. In addition, US '548 seems to construe the term ALD as including RVD: the silicon dioxide layers of the 'ALD-deposited $Al_2O_3/SiO_2$ nanolaminates' of US '548 are in fact constructed by means of RVD (see, inter alia, para. 44). It will be clear that the term ALD in the present text is not to be construed as encompassing RVD since both processes result in films having distinctly different qualities.

U.S. Pat. No. 7,297,608 (Papasouliotis et al.) discloses a method to produce a silicon dioxide film having a low WERR. U.S. Pat. No. '608 teaches to anneal silicon RVD-deposited dioxide films at a low temperature using high density plasma (HDP) under oxidizing conditions. After annealing, the resulting films are reported to have WERR-values as low as 1.6. A relation between the HDP anneal temperature and the obtained WERR-value is elucidated briefly, while no other parameters of the film formation process are related to the WERR-values of the deposited and subsequently annealed films. In addition it is noted that U.S. Pat. No. '608 does not disclose the deposition of a silicon dioxide/metal oxide-nanolaminate since (mono)layers of metal oxide are missing, and that the silicon dioxide layers are deposited by RVD instead of ALD.

The aforementioned and other features and advantages of the invention will be more fully understood from the following detailed description of certain embodiments of the invention, taken together with the accompanying drawings, which are meant to illustrate and not to limit the invention.

DETAILED DESCRIPTION

Figure 1:
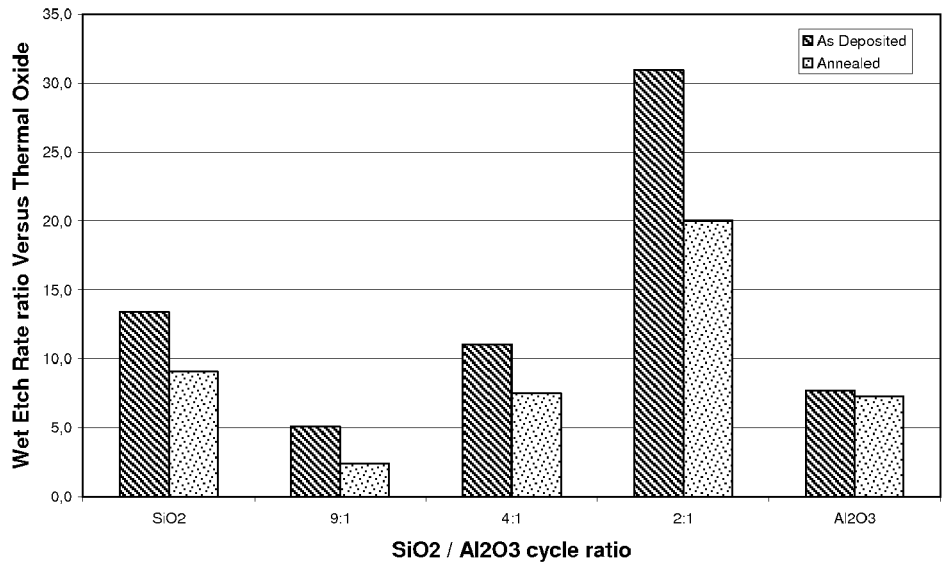
FIG. 1 is a graph illustrating the dependency of the WERR of a $[xSiO_2/yAl_2O_3]_n$ nanolaminate on the compositional ratio x:y between silicon dioxide and aluminum oxide, the aluminum oxide layers being one monolayer thick.

ALD is a deposition method that allows for the deposition of thin films in a precisely controlled way. Typically, ALD uses two or more gaseous precursors that are alternately and repeatedly applied to a substrate. A series of sequential steps in which a surface of the substrate is exposed to all precursors is called a deposition cycle. Each deposition cycle typically grows a single monolayer of film. This is due to the fact that in ALD the film growth depends on chemisorption, a process whereby a precursor molecule adheres to a substrate's surface through the formation of a chemical bond without further thermal decomposition of the precursor molecule taking place. Chemisorption stops naturally when all substrate surface sites available for chemical bonding with a precursor have been covered. Exposing the substrate to the second precursor results in a chemical reaction of the second precursor with the chemisorbed first precursor under the formation of a solid film, until all of the chemisorbed first precursor has been reacted and the substrate is covered with chemisorbed second precursor in a self-limiting manner. Consequently, ALD is a deposition method that enables highly conformal coating by high quality films. These characteristics make it a method of interest to various industries, among which in particular the semiconductor, and more specifically, the solar cell industry. It will be understood that a nanolaminate may be manufactured by depositing thin films of different materials on top of each other. Each film may eventually form a layer (typically having a thickness on the order of nanometers) within the nanolaminate, wherein each layer may further comprise one or more monolayers of the respective material of which the film is made.

For practical purposes, the term 'monolayer' as used in this text is to be construed as a layer that is formed by self limiting absorption as described above, through exposure of a substrate to a single deposition cycle. Due to steric hindrance of adsorbed precursor molecules, wherein a precursor molecule adsorbed at a surface site may prevent the adsorption of another precursor molecule at a directly adjacent surface site, a self limiting layer may in fact be a fraction of a true, full monolayer.

Further, in relation to the fact that the method for manufacturing a nanolaminate according to the present invention is based on ALD, which deposition method naturally grows monolayers, the term 'compositional ratio' as used in this text with regard to the nanolaminate is to be construed as the ratio of monolayers of silicon dioxide and a respective metal oxide within said nanolaminate.

ALD may be carried out conventionally in a batch process chamber. After placing a large number of substrates in such a process chamber, precursors may be introduced therein sequentially and alternatingly. In between precursor pulses, the process chamber may typically be purged by an inert gas to remove any remaining precursor material. Batch furnaces provide for an economical way of depositing films on substrates. Alternatively the ALD process may be carried out in a single wafer reactor. A further alternative are provided by linear ALD processing tracks which have recently been developed (see for example U.S. patent application Ser. No. 12/123,745 in the name of ASM International). Such ALD tracks include an elongate process space or tunnel through which a substrate to be treated is conveyed. During its passage through the tunnel, the substrate travels through successive gas zones, successively comprising a first precursor, a purge gas, a second precursor, a purge gas, etc. The linear nature of the process tunnel enables a continuous stream of substrates to be processed, thus delivering an ALD apparatus with an effective deposition rate and throughput capacity that are appreciably greater than that of conventional batch process apparatus.

Irrespective of the equipment used, a regular silicon dioxide/aluminum oxide-nanolaminate according to the formula $[xSiO_2/yAl_2O_3]n$ may be manufactured as follows. First a silicon dioxide film may be formed by sequentially and alternatingly exposing a substrate to a silicon-containing precursor, e.g. (diethylamino)silane (BDEAS, $SiH_2(NEt_2)_2$), and an oxygen-containing precursor, e.g. ozone ($O_3$). The sequential exposition of the substrate to the two precursors may be repeated x times to obtain a silicon dioxide film of x monolayers thick. Subsequently, an aluminum oxide film may be grown on top of the silicon dioxide layer by sequentially and alternatingly exposing the substrate to an aluminum-containing precursor, e.g. trimethylaluminum (TMA, $Al_2(CH_3)_6$), and an oxygen-containing precursor, e.g. ozone ($O_3$). The sequential exposition of the substrate surface to these latter two precursors may be repeated y times to obtain an aluminum oxide film of y monolayers thick. Then the total sequence of x deposition cycles for $SiO_2$ and y deposition cycles for $Al_2O_3$ may be repeated n times to obtain a nanolaminate having the desired thickness. If desired, the nanolaminate may eventually be subjected to a post-deposition anneal, for example 10 minutes at 600° C. in an $N_2$ atmosphere at low pressure.

In experiments nanolaminates have been deposited using an A412 vertical furnace of ASM International, at a deposition temperature of 300° C., in accordance with the above scheme. These nanolaminates have then been tested for their wet etch rate in a hydrofluoric acid solution. In these particular experiments a 0.5% HF solution in water was used. FIGS. 1. and 2 illustrate the results of these experiments.

FIG. 1 is a graph that illustrates the dependency of the WERR of $[xSiO_2/yAl_2O_3]_n$ nanolaminate on the compositional ratio (or ALD-cycle ratio) x:y between silicon dioxide and aluminum oxide. The nanolaminates in FIG. 1 have compositional ratios x:y of respectively 9:1, 4:1 and 2:1. For each of these laminates, the WERR is listed for both a non-annealed and an annealed specimen. The results for the nanolaminates are flanked by those for pure ALD-deposited $SiO_2$-films and $Al_2O_3$-films for comparison. The aluminum oxide content of the films/nanolaminates thus increases from left to right in FIG. 1.

As can be seen in FIG. 1, the WERR of a nanolaminate depends significantly on its compositional ratio. What is surprising, is how the WERR of the nanolaminates depends on the amount of aluminum oxide therein. At a compositional ratio of 9:1, the nanolaminate has a WERR smaller than that of both the $SiO_2$ and the $Al_2O_3$ film. In contrast, at a compositional ratio of 2:1, the nanolaminate has a WERR greater than that of both the $SiO_2$ and the $Al_2O_3$ film. At a compositional ratio of 4:1 the WERR of the nanolaminate falls somewhere between those of the $SiO_2$ and the $Al_2O_3$ films. This is so for both the non-annealed and annealed specimens. The post-deposition annealing step is demonstrated to lower the WERR of the nanolaminates by about 50%-30%.

Figure 2:
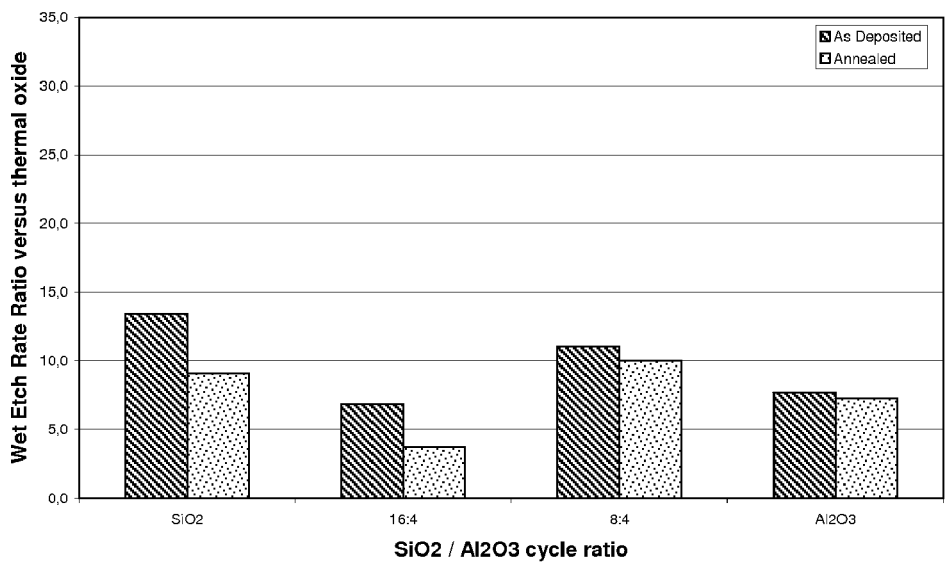
FIG. 2 is a graph illustrating the dependency of the WERR of a $[xSiO_2/yAl_2O_3]_n$ nanolaminate on the compositional ratio x:y between silicon dioxide and aluminum oxide, the aluminum oxide layers being four monolayers thick.

FIG. 2 is a graph that illustrates the dependency of the WERR of another batch of $[xSiO_2/yAl_2O_3]n$ nanolaminates on the compositional ratio (or ALD-cycle ratio) x:y between silicon dioxide and aluminum oxide. This batch comprises nanolaminates with a compositional ratios x:y of respectively 16:4 and 8:4. For each of these laminates the WERR is again listed for both a non-annealed and an annealed specimen, and the results for the nanolaminates are again flanked by those for pure ALD-deposited $SiO_2$-films and $Al_2O_3$-films for comparison.

As can be seen in FIG. 2, a nanolaminate having a compositional ratio of 16:4 has a WERR smaller than that of both the $SiO_2$ and the $Al_2O_3$ film. In contrast, at a compositional ratio of 8:4, a nanolaminate has a WERR greater than that of both the $SiO_2$ and the $Al_2O_3$ film. This is so for both the non-annealed and annealed specimens.

The results of the experiments clearly illustrate that it is possible to manufacture ALD-deposited silicon dioxide/metal oxide-nanolaminates having a wet etch rate is either greater or smaller than both a wet etch rate of a film of silicon dioxide and a wet etch rate of a film of said metal oxide in the same etchant. Accordingly, the WERR of a silicon dioxide-based film may be adjusted advantageously by interspersing it with layers of a metal oxide, creating more flexibility in semiconductor manufacturing processes.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims. It will be clear, for example, that other precursors than those mentioned may be used to deposit the (layers of the) nanolaminates, e.g. silane, siloxane and silazane compounds as silicon containing precursor. The following are mentioned as examples of preferred silane, siloxane and silazane compounds:

Silanes of the formula $Si_mL_{2m+2}$ (I)

wherein m is an integer 1-3,

Siloxanes of the formula $Si_yO_{y-1}L_{2y+2}$ (II)

wherein y is an integer 2-4, and

Silazanes of the formula $Si_yNH_{y-1}L_{2y+2}$ (III)

wherein y is an integer 2-4.

In formulae (I)-(III) each L can independently be F, Cl, Br, I, alkyl, aryl, alkoxy, vinyl (—CH=$CH_2$), cyano (—CN), amino, silyl (H3Si—), alkylsilyl, alkoxysilyl, silylene or alkylsiloxane whereby alkyl and alkoxy groups can be linear or branched and contain at least one substituent. Typically alkyl and alkoxy groups contain 1-10 carbon atoms, most preferably 1-6 carbon atoms.

As examples of especially preferred silicon compounds amino-substituted silanes and silazanes, such as aminoalkyltrialkoxy silanes, for example 3-aminopropyltriethoxy silane $NH_2$—$CH_2CH_2CH_2$—Si(O—$CH_2CH_3$)$_3$ (AMTES) and 3-aminopropyltrimethoxy silane ($NH_2$—$CH_2CH_2CH_2$—Si(O—$CH_3$)$_3$ (AMTMS) and hexa-alkyldisilazane $(CH_3)_3Si$—NH—$Si(CH_3)_3$ (HMDS) and hexakis-monoethylamino disilane $Si_2(NHEt)_6$ (AHEAD) can be mentioned.

For the metal precursor, any other organo-metal compound including but not limited to metal alkyl compounds can be used. Further, metal halides can be used as metal precursors.

Likewise, other deposition equipment than used for the described experiments, e.g. a single wafer reactor or a linear ALD processing track instead of a batch furnace, and/or other deposition temperatures, e.g. a temperature in the range of 250° C. and 400° C., may be used. Furthermore, the nanolaminates do not necessarily have to have a regular or repetitive structure: the thickness of each metal oxide resp. silicon dioxide layer may be approximately the same, but need not be. The term 'compositional ratio' may thus pertain to the compositional ratio of a repetitive structure of the nanolaminate, to the overall compositional ratio (as may be the case for non-regular nanolaminates), or to both (as in the case of a regular nanolaminate according to the formula $[xSiO_2/yMO]_n$, with MO denoting the metal oxide. It is also noted that particular features, structures, or characteristics of one or more embodiments may be combined in any suitable manner to form new, not explicitly described embodiments.

We claim:

1. A method for manufacturing a nanolaminate, wherein said nanolaminate comprises a number of alternating atomic layer deposition-deposited layers of silicon dioxide and a metal oxide, and wherein said nanolaminate has a desired wet etch rate with respect to an etchant, the method comprising:

choosing the desired wet etch rate for the nanolaminate to be manufactured;

determining, from a predetermined relation between wet etch rates of atomic layer deposition-deposited silicon dioxide/metal oxide-nanolaminates and their compositional ratios, what compositional ratio of silicon dioxide and said metal oxide is required to obtain a nanolaminate with the desired wet etch rate; and manufacturing the nanolaminate with the determined compositional ratio, said manufacturing comprising:

A: depositing a first number of silicon dioxide monolayers so as to form a silicon dioxide layer;

B: depositing a second number of metal oxide monolayers so as to form a metal oxide layer; and repeating the steps A and B—if desired with different first and second numbers—until a desired nanolaminate thickness is achieved, wherein the desired wet etch rate of the nanolaminate is either greater than a greatest or smaller than a smallest of a wet etch rate of a film of said nanolaminate-constituting silicon dioxide and a wet etch rate of a film of said nanolaminate-constituting metal oxide in said etchant.

2. The method according to claim 1, wherein depositing a silicon dioxide monolayer involves a first precursor and a second precursor, wherein said first precursor is bis(diethylamino)silane (SiH2(NEt2)2).

3. The method according to claim 2, wherein said second precursor is ozone (O3).

4. The method according to claim 1, wherein the compositional ratio of the nanolaminate, i.e. the ratio between a number of silicon dioxide monolayers and metal oxide monolayers in the nanolaminate, is 4:1 or greater.

5. The method according to claim 1, wherein substantially each metal oxide layer of the nanolaminate is one monolayer thick.

6. The method according to claim 1, wherein for each repetition of the steps A and B, the first number and the second number are the same, such that a regular nanolaminate is obtained.

* * * * *

UNITED STATES PATENT AND TRADEMARK OFFICE
CERTIFICATE OF CORRECTION

PATENT NO. : 8,242,029 B2  
APPLICATION NO. : 12/623871  
DATED : August 14, 2012  
INVENTOR(S) : Peter Zagwijn et al.

Page 1 of 1

It is certified that error appears in the above-identified patent and that said Letters Patent is hereby corrected as shown below:

Title Page, (75) Inventors, "Peter Zagwijn, LX Nijkerk (NL)" should read -- Peter Zagwijn, Nijkerk (NL) --.

Signed and Sealed this  
Fourth Day of December, 2012

David J. Kappos  
*Director of the United States Patent and Trademark Office*